United States Patent
Chuu et al.

(10) Patent No.: US 11,430,666 B2
(45) Date of Patent: Aug. 30, 2022

(54) SEMICONDUCTOR DEVICE AND METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Chih-Piao Chuu, Hsinchu (TW); Ming-Yang Li, Hsinchu (TW); Lain-Jong Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/732,205

(22) Filed: Dec. 31, 2019

(65) Prior Publication Data

US 2021/0202265 A1   Jul. 1, 2021

(51) Int. Cl.
*H01L 21/00* (2006.01)
*H01L 21/441* (2006.01)
*H01L 21/02* (2006.01)
*H01L 29/786* (2006.01)
*H01L 29/24* (2006.01)
*H01L 29/66* (2006.01)

(52) U.S. Cl.
CPC ...... *H01L 21/441* (2013.01); *H01L 21/02568* (2013.01); *H01L 29/24* (2013.01); *H01L 29/66969* (2013.01); *H01L 29/786* (2013.01)

(58) Field of Classification Search
CPC . H01L 21/441; H01L 21/02568; H01L 29/24; H01L 29/66969; H01L 29/786
See application file for complete search history.

(56) References Cited

U.S. PATENT DOCUMENTS

| | | | | |
|---|---|---|---|---|
| 5,573,958 A | * | 11/1996 | Fukui | G02F 1/13458 257/E21.414 |
| 2015/0294875 A1 | | 10/2015 | Khondaker et al. | |
| 2018/0005824 A1 | * | 1/2018 | Lin | H01L 21/02694 |
| 2018/0269059 A1 | * | 9/2018 | Lin | H01L 29/78681 |

(Continued)

FOREIGN PATENT DOCUMENTS

| KR | 10-2018-0065396 A | 6/2018 |
|---|---|---|
| KR | 10-2018-0123779 A | 11/2018 |
| KR | 10-2019-0012891 A | 2/2019 |

(Continued)

OTHER PUBLICATIONS

Mahmut Tosun et al., "Air-Stable n-Doping of WSe2 by Anion Vacancy Formation with Mild Plasma Treatment," ACS Nano, vol. 10, pp. 6853-6860 (2016) <https://doi.org/10.1021/acsnano.6b02521>.

(Continued)

*Primary Examiner* — Richard A Booth
(74) *Attorney, Agent, or Firm* — McDermott Will & Emery LLP

(57) ABSTRACT

A method of fabricating a semiconductor device includes applying a plasma to a portion of a metal dichalcogenide film. The metal dichalcogenide film includes a first metal and a chalcogen selected from the group consisting of S, Se, Te, and combinations thereof. A metal layer including a second metal is formed over the portion of the metal dichalcogenide film after applying the plasma.

20 Claims, 16 Drawing Sheets

(56) References Cited

U.S. PATENT DOCUMENTS

2019/0279900 A1* 9/2019 Mullick .............. C23C 14/0623

FOREIGN PATENT DOCUMENTS

TW        201836006 A    10/2018
WO    2019/191031 A1    10/2019

OTHER PUBLICATIONS

Pavel Bolshakov et al., "Contact Engineering for Dual-Gate MoS2 Transistors Using O2 Plasma Exposure," ACS Applied Electronic Materials, vol. 1, pp. 210-219 (2019) <https://doi.org/10.1021/acsaelm.8b00059>.
B. Radisavljevic et al., "Single-layer MoS2 transistors," Nature Nanotechnolgoy, vol. 6, pp. 147-150 (2011).
Ang-Yu Lu et al., "Janus monolayers of transition metal dichalcogenides," Nature Nanotechnology 12, 744-749 (2017).

* cited by examiner

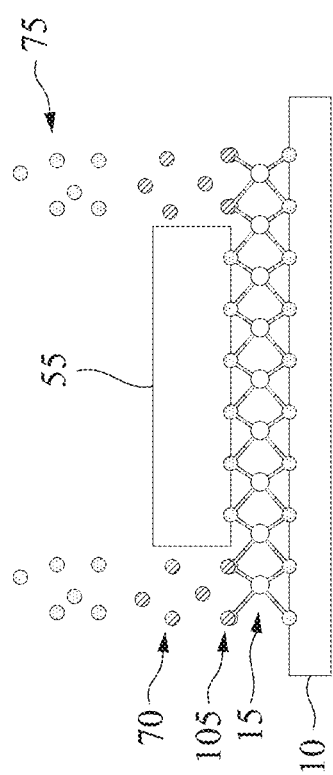

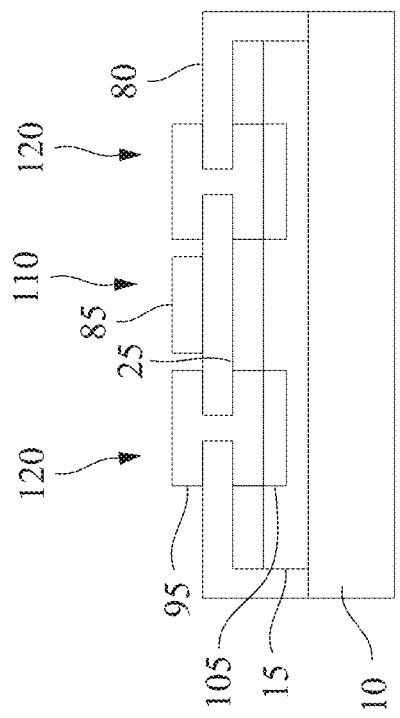
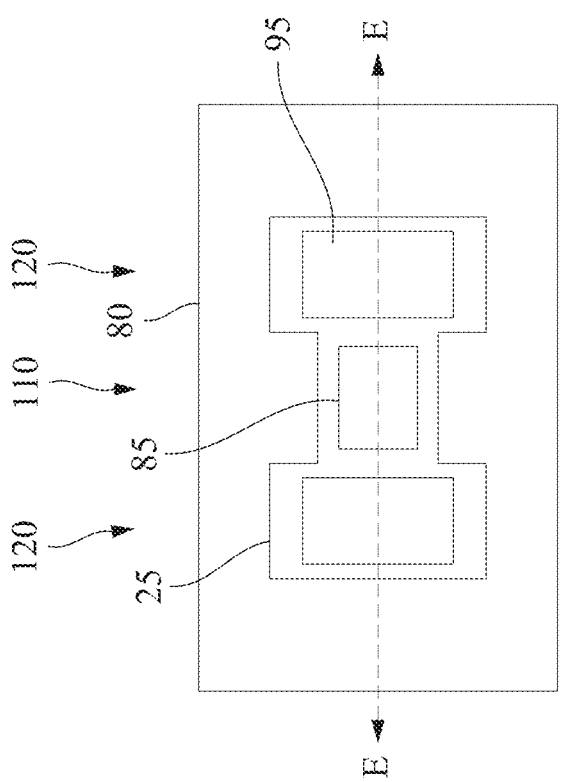
FIG. 18B
FIG. 18A

SEMICONDUCTOR DEVICE AND METHOD OF MANUFACTURING SEMICONDUCTOR DEVICE

BACKGROUND

A two-dimensional semiconductor (also known as a 2D semiconductor) is a type of natural semiconductor with thicknesses on the atomic scale. Transition metal dichalcogenides have been used in 2D devices. Performance of single 2D transition metal dichalcogenide materials for device applications is reaching an upper limit. Electrical resistance at the junction of the source/drain regions and the source/drain electrode contact is a performance limiting factor in 2D devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 12 is a schematic cross-sectional view of a stage of a sequential method of fabricating a semiconductor device according to an embodiment of the disclosure.

FIGS. 18A and 18B are a plan view and a cross-sectional view of a stage of a sequential method of fabricating a semiconductor device according to an embodiment of the disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
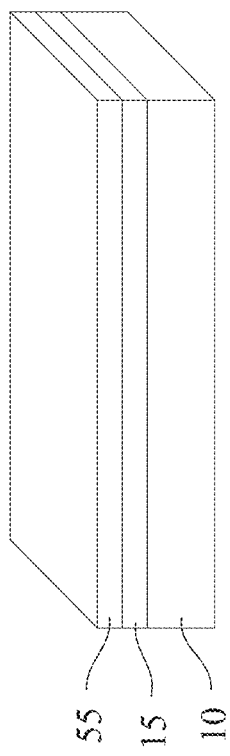
FIGS. 1A and 1B are an isometric view and a cross-sectional view of a stage of a sequential method of fabricating a semiconductor device according to an embodiment of the disclosure.
Figure 1B:
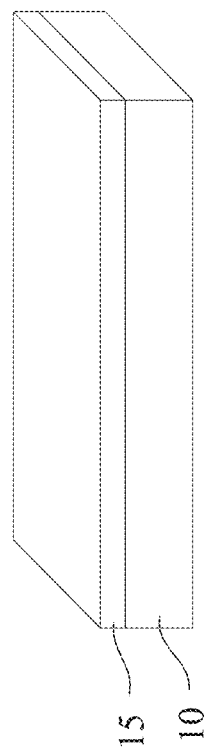

FIGS. 1A and 1B are an isometric view and a cross-sectional view of a stage of a sequential method of fabricating a semiconductor device according to an embodiment of the disclosure.

As shown in FIGS. 1A and 1B, a 2D metal chalcogenide film 15 is formed over a substrate 10 in some embodiments. In some embodiments, the 2D material is a metal chalcogenide, such as a metal dichalcogenide, except a metal oxide, having a layer thickness of about 0.5 nm to about 10 nm. In some embodiments, the metal dichalcogenide is a transition metal dichalcogenide. In some embodiments, the metal is selected from the group consisting of Mo, W, Pd, and Hf. In some embodiments, the chalcogen X is one or more selected from the group consisting of S, Se, and Te. In some embodiments, the transition metal dichalcogenide is selected from the group consisting of $MoS_2$, $WS_2$, $MoSe_2$, $WSe_2$, $MoTe_2$, and $WTe_2$.

In some embodiments, the substrate 10 is a conductive material, such as doped silicon or intrinsic silicon. In some embodiments, the substrate is an insulator, such as silicon oxide or aluminum oxide. In some embodiments, the substrate includes conductive material with an insulator layer formed thereon. In some embodiments, the substrate includes silicon dioxide disposed over a silicon wafer. In other embodiments, suitable aluminum oxide substrates include sapphire.

In some embodiments, the metal dichalcogenide film 15 is a monolayer film. In other embodiments, the metal dichalcogenide film 15 includes a plurality of monolayer films in a stacked arrangement.

In some embodiments, the metal dichalcogenide film 15, represented by $MX_2$ is formed by a transfer operation, chemical vapor deposition (CVD), physical vapor deposition (PVD), molecular beam epitaxy (MBE), or phase transition operation. To form a metal dichalcogenide film, in some embodiments of the present disclosure, a metal film is deposited on a substrate, by using an RF sputtering system. The metal film is subsequently converted to a metal dichalcogenide film. For example, in some embodiments, a metal, such as molybdenum, is deposited, on a substrate, such as sapphire, by sputtering at a power ranging from about 10 W to about 100 W at a background pressure of from about $5 \times 10^{-2}$ Torr to about $5 \times 10^{-4}$ Torr with an Ar gas flow of from about 10 sccm to about 100 sccm. After metal deposition, the substrates are placed in the center of a hot furnace for chalcogenization, such as sulfurization. During the sulfurization procedure, Ar gas at a flow rate of from about 40 sccm to about 200 sccm is used as a carrier gas, and the furnace pressure ranges from about 0.1 Torr to about 10 Torr. The sulfurization temperature is from about 400° C. to about 1200° C. About 0.5 g to about 2 g of S powder, is heated in the gas flow stream to its evaporation temperature at about 120° C. to about 200° C. upstream of the furnace in some embodiments.

In a certain embodiment, the molybdenum is deposited on the sapphire substrate by sputtering at a power of about 40 W at a background pressure of about $5 \times 10^{-3}$ Torr with about a 40 sccm Ar gas flow. The sulfurization operation takes place at an Ar flow rate of about 130 sccm, and a furnace pressure of about 0.7 Torr in a furnace at about 800° C. The S powder (about 1.5 g) is placed in the gas flow upstream of the furnace and is heated to its evaporation temperature of about 120° C. Large-area $MoS_2$ films can be obtained on the sapphire substrate by using this growth technique.

In some embodiments, instead of the sulfurization operation to form S-based materials ($MoS_2$, $WS_2$, etc.); selenization is performed to form Se-based materials, such as $MoSe_2$ and $WSe_2$; or tellurization is performed to form Te-based materials, such as $MoTe_2$ and $WTe_2$. The parameters of the chalcogenization operation (e.g.—temperature, pressure), are adjusted as necessary for selenium or tellurium-based materials.

In some embodiments, metal dichalcogenide films except metal oxide films are directly formed on the device substrate, and in other embodiments, the metal dichalcogenide films are formed on another substrate and then transferred to the device substrate. For example, a first metal dichalcogenide film except a metal oxide film having a thickness of about 0.5 nm to about 10 nm is formed on a first substrate. The first metal dichalcogenide film is formed by chemical vapor deposition (CVD) in some embodiments. In other embodiments, a first metal film is formed by sputtering or atomic layer deposition and then the metal film is converted to a metal dichalcogenide by reacting the metal film with a chalcogen except oxygen. A polymer film having a thickness ranging from about 100 nm to about 5 μm is subsequently formed on first metal dichalcogenide film. In some embodiments, the polymer film is poly(methyl methacrylate) (PMMA). After forming the polymer film, the sample is heated, such as by placing the sample on a hot plate. The sample may be heated from about 30 seconds to about 20 minutes at a temperature of from about 70° C. to about 200° C. Subsequent to heating, a corner of the first metal dichalcogenide film is peeled off the substrate, such as by using a tweezers, and the sample is submerged in a solution to facilitate the separation of the first metal dichalcogenide film from the first substrate. In some embodiments, the solution is an aqueous base solution. The first metal dichalcogenide film and polymer film are transferred to a second substrate. After applying the first metal dichalcogenide film to the second substrate, the sample may stand for 30 minutes to 24 hours in some embodiments. In some embodiments, the second substrate includes silicon oxide or aluminum oxide substrates. In some embodiments, suitable silicon oxide substrates include a silicon dioxide layer formed on a silicon layer. In other embodiments, suitable aluminum oxide substrates include sapphire. The polymer film is removed from the first metal dichalcogenide film using a suitable solvent. In some embodiments, the second substrate/first metal dichalcogenide film/polymer film structure is submerged in a suitable solvent until the polymer film is dissolved. Any solvent suitable for dissolving the polymer film can be used. For example, in some embodiments, when the polymer film is a PMMA film, acetone is used as the solvent. The first metal dichalcogenide film and second substrate are subsequently annealed in some embodiments by heating in an oven at a temperature of about 200° C. to about 500° C. for about 30 minutes to about 5 hours, to provide the transferred metal dichalcogenide film on a second substrate.

In one embodiment, the film transferring operations of 2D metal sulfide crystal films is performed as follows: (1) 1.5 µm-thick poly(methyl methacrylate) (PMMA) layer is spin-coated on the 2D metal sulfide crystal film; (2) the sample is heated on a hot plate at 120° C. for 5 min; (3) a small portion at a corner of the PMMA/2D crystal film is peeled off from the sapphire substrate with tweezers; (4) the sample is submerged in a KOH solution, and the PMMA/2D crystal film is completely peeled off; (5) the PMMA/2D crystal film is placed on a 300 nm $SiO_2$/Si substrate; (6) the sample is left to stand under atmospheric condition for 8 hours; (7) the sample is then submerged in acetone to remove the PMMA; and (8) the sample is annealed in a furnace at 350° C. for 2 hours to leave the 2D metal sulfide crystal film remaining on the surface of the $SiO_2$/Si substrate.

Figure 2A:
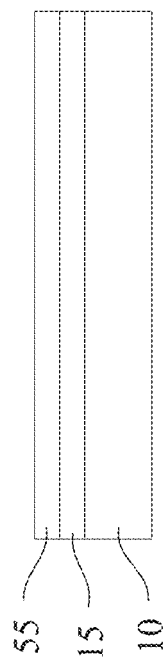
FIGS. 2A and 2B are an isometric view and a cross-sectional view of a stage of a sequential method of fabricating a semiconductor device according to an embodiment of the disclosure.
Figure 2B:
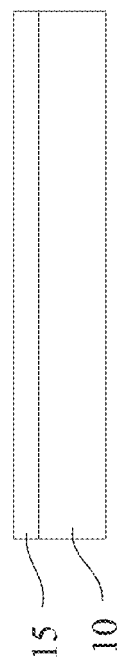

FIGS. 2A and 2B are an isometric view and a cross-sectional view of a stage of a sequential method of fabricating a semiconductor device according to an embodiment of the disclosure. As shown in FIGS. 2A and 2B, a buffer layer 55 is formed over the 2D metal dichalcogenide layer 15. In some embodiments, the buffer layer is a photoresist or an insulating layer, such as an oxide layer. In some embodiments, the oxide layer is a silicon oxide, such as $SiO_2$, or an aluminum oxide, such as $Al_2O_3$. In some embodiments, the thickness of the buffer layer 55 ranges from about 5 nm to about 100 nm. In some embodiments, the thickness of the buffer layer 55 ranges from about 10 nm to about 50 nm. In some embodiments, the buffer layer is formed by a photoresist deposition operation, CVD, or PVD operation.

Figure 3A:
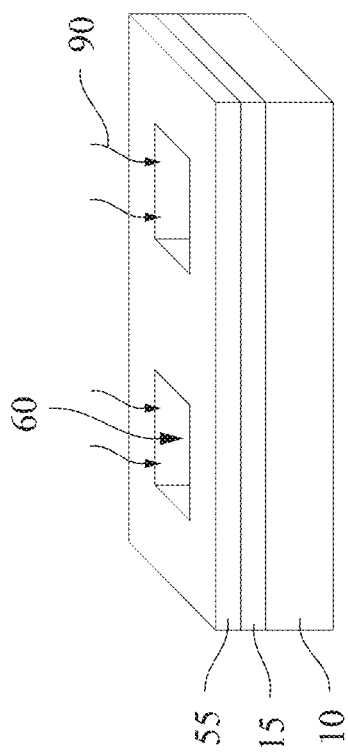
FIGS. 3A and 3B are an isometric view and a cross-sectional view of a stage of a sequential method of fabricating a semiconductor device according to an embodiment of the disclosure.
Figure 3B:
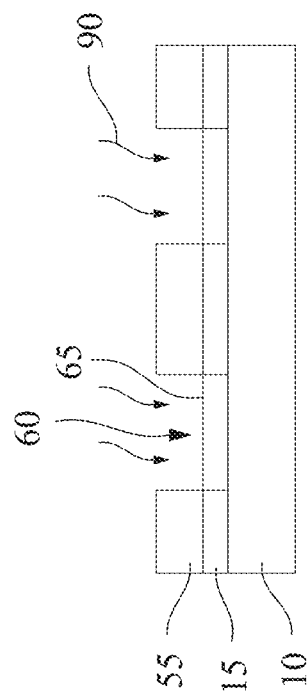

FIGS. 3A and 3B are an isometric view and a cross-sectional view of a stage of a sequential method of fabricating a semiconductor device according to an embodiment of the disclosure. As shown in FIGS. 3A and 3B, the buffer layer 55 is patterned to form openings 60 in the buffer layer. The openings expose a portion of the metal dichalcogenide layer 15. The exposed portions of the metal dichalcogenide layer 15 are the source/drain regions of the semiconductor device in some embodiments. When the buffer layer 55 is a photoresist layer, the photoresist is patterned by photolithographic techniques, including selectively exposing the photoresist layer to actinic radiation and developing the selectively exposed photoresist layer. When the buffer layer 55 is an oxide layer, a photoresist layer is formed over the buffer layer and photolithographic and etching operations are performed to form the openings 60 in the buffer layer 55, followed by removing the photoresist layer by a suitable photoresist stripping or ashing operation in some embodiments.

Figure 4A:
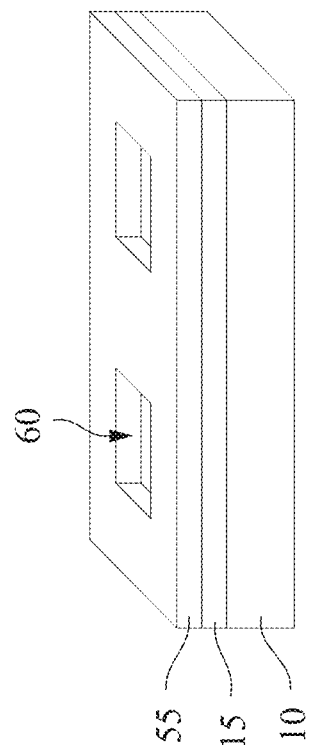
FIGS. 4A and 4B are an isometric view and a cross-sectional view of a stage of a sequential method of fabricating a semiconductor device according to an embodiment of the disclosure.
Figure 4B:
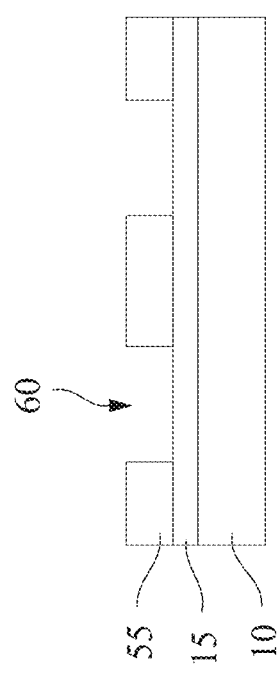

FIGS. 4A and 4B are an isometric view and a cross-sectional view of a stage of a sequential method of fabricating a semiconductor device according to an embodiment of the disclosure. As shown in FIGS. 4A and 4B, a plasma 90 is applied to the device. The plasma 90 interacts with the exposed portions of the metal dichalcogenide layer 15. In some embodiments, the plasma 90 is a hydrogen plasma. In some embodiments, chalcogen X of $MX_2$ is removed at a surface portion 65 of the metal dichalcogenide layer 15 and replaced with hydrogen to form a metal chalcogenide hydride, MXH. In some embodiments, the hydrogen replacement is performed using a plasma stripping operation. In embodiments of the plasma stripping operation, a hydrogen plasma is applied to the surface of a metal dichalcogenide film. The hydrogen plasma strips the chalcogen at portions 65 of the surface of the metal dichalcogenide film exposed to the hydrogen plasma, and the hydrogen in the plasma replaces the chalcogen removed from the surface of the metal dichalcogenide film. The portions 65 of the surface of the metal dichalcogenide layer where the hydrogen replaces the chalcogen is the uppermost layer of chalcogen of the metal chalcogenide (see FIG. 9).

In some embodiments, the plasma is applied at a pressure ranging from about 10 mTorr to about 500 mTorr. In some embodiments, the plasma is applied at a pressure ranging from about 20 mTorr to about 300 mTorr, in other embodiments, the plasma is applied at a pressure ranging from about 50 mTorr to about 200 mTorr. In some embodiments, the plasma is applied at a power ranging from about 10 W to about 150 W. In some embodiments, the plasma is applied at a power ranging from about 20 W to about 100 W, and in other embodiments, the plasma is applied at a power ranging from about 30 W to about 50 W.

Figure 5A:
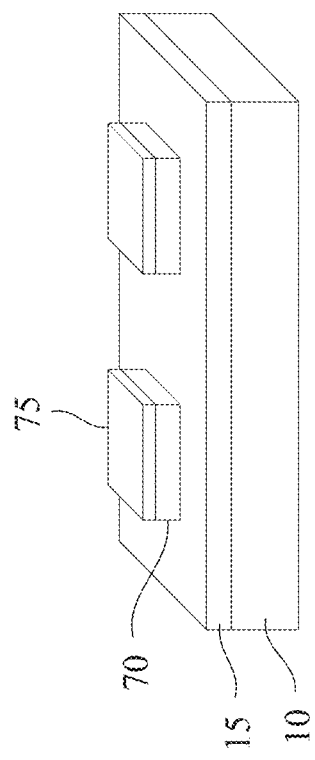
FIGS. 5A and 5B are an isometric view and a cross-sectional view of a stage of a sequential method of fabricating a semiconductor device according to an embodiment of the disclosure.
Figure 5B:
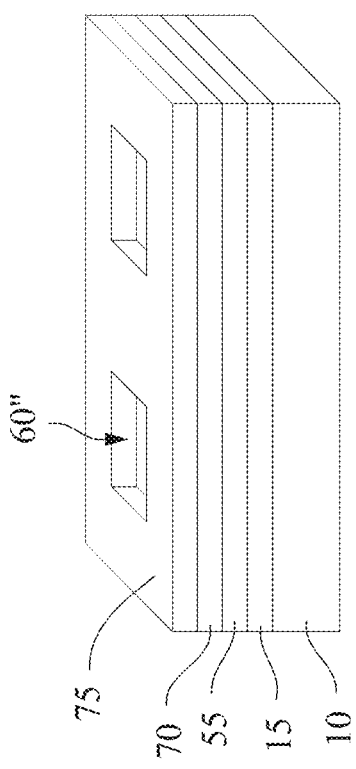

FIGS. 5A and 5B are an isometric view and a cross-sectional view of a stage of a sequential method of fabricating a semiconductor device according to an embodiment of the disclosure. As shown in FIGS. 5A and 5B, a first metal layer 70 is formed over the device. The first metal layer 70 is a made of a second metal, where the metal of the metal dichalcogenide is the first metal. In some embodiments, the second metal is a different metal than the first metal. In some embodiments, the second metal is more reactive than the metal of the metal dichalcogenide layer 15 (the first metal). The reactive metal (second metal) is applied to the surface 65 of the metal chalcogenide film that was treated with the plasma. Applying the reactive metal to the metal chalcogenide hydride film, MXH, removes the hydrogen from the MXH film and replaces the hydrogen with the reactive metal forming a film MXM2, where M is the metal of the metal chalcogenide film, X is the chalcogen, and M2 is the reactive metal (second metal) 70. In some embodiments, the reactive metal chemically bonds with the first metal of the metal chalcogenide film. In some embodiments, the reactive metal forms an alloy with the metal of the metal chalcogenide film to form an alloy layer 105. In some embodiments, the reactive metal is one or more selected from the group of consisting of Ni, Mo, In, Ti, W, Sc, Pd, Pt, Co, and Ru. In some embodiments, the metal dichalcogenide film, $MX_2$; and metal chalcogenide hydride film, MXH, are monolayer films. The film MXM2 is a portion of the combined and alloy bonded metal chalcogenide film and the first metal layer.

The formation of the metal-reactive metal alloy 105 at the interface between the reactive metal and the metal of the metal chalcogenide film forms an interface with reduced electrical resistance. In other words, forming the metal-reactive metal alloy 105 at the interface provides a highly conductive contact between a semiconductor material and an electrical contact due to the all metal contact. The metal-reactive metal alloy 105 eliminates the van der Waals air gap between a metal contact layer and the metal chalcogenide semiconductor layer. The reactive metal is used as a glue to form a metal alloy between a top metal pad and the reactive metal, and between the reactive metal and the metal chalcogenide layer MX. The metal-reactive metal interface also provides a seamless edge contact of MX-MXM2 between source/drain regions and channel regions of a semiconductor device.

In some embodiments, the thickness of the first metal layer 70 ranges from about 1 nm to about 25 nm. In other embodiments, the thickness of the first metal layer 70 ranges from about 2 to about 15 nm.

In an embodiment, the first metal layer 70 is formed at a temperature ranging from 100° C. to 300° C. or the device is heated to a temperature ranging from 100° C. to 300° C. (or annealed at a temperature ranging from 100° C. to 300° C.) after forming the first metal layer.

In some embodiments, a second metal layer 75 is formed over the first metal layer 70. The second metal layer 75 is made of a third metal that is less reactive than the second metal. Because the second metal of the first metal layer 70 is more reactive it is more susceptible to oxidation. The second metal layer 15 is less susceptible to oxidation and protects the contacts from oxidizing and the increased resistivity resulting from the oxidation.

In some embodiments, the second metal layer 75 is made of Au, Pt, Cu, or TiN. In some embodiments, the thickness of the second metal layer 75 ranges from about 10 nm to about 100 nm. In other embodiments, the thickness of the second metal layer 75 ranges from about 20 nm to about 50 nm.

Because the reactive metal layer 70 (the first metal layer) may be oxidized in air, a protective metal layer 75 (the second metal layer), having a lower reactivity than the reactive metal layer is formed over the reactive metal layer in some embodiments.

Figure 6A:
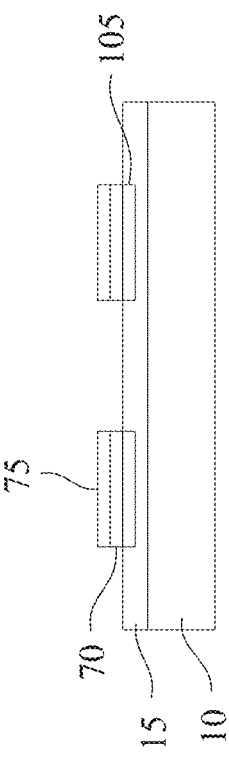
FIGS. 6A and 6B are an isometric view and a cross-sectional view of a stage of a sequential method of fabricating a semiconductor device according to an embodiment of the disclosure.
Figure 6B:
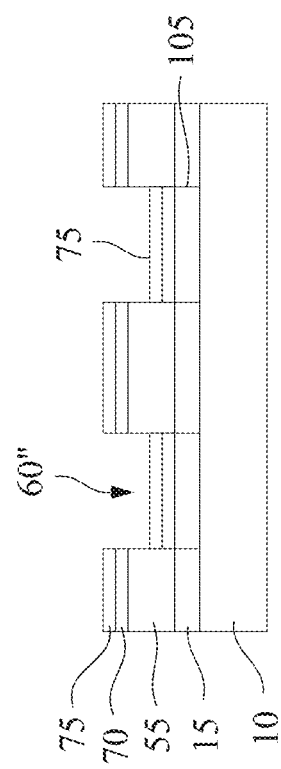

FIGS. 6A and 6B are an isometric view and a cross-sectional view of a stage of a sequential method of fabricating a semiconductor device according to an embodiment of the disclosure. As shown in FIGS. 6A and 6B, the buffer layer 55, first metal layer 70, and second metal layer 75 over the buffer layer 55 are removed in regions of the device other than the source/drain regions. The layers are removed by suitable photolithographic or etching operations, such as a lift-off operation by wet etching.

Figure 7A:
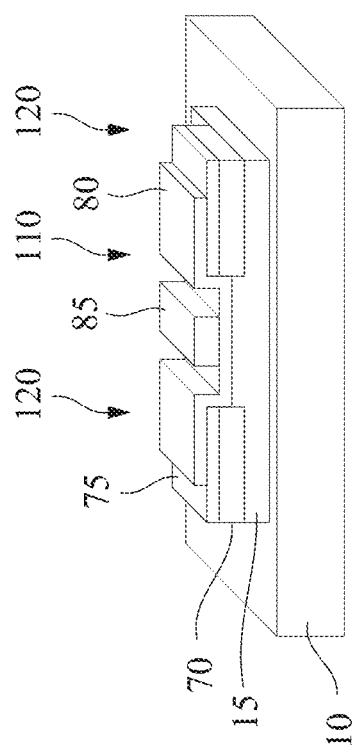
FIGS. 7A and 7B are an isometric view and a cross-sectional view of a stage of a sequential method of fabricating a semiconductor device according to an embodiment of the disclosure.
Figure 7B:
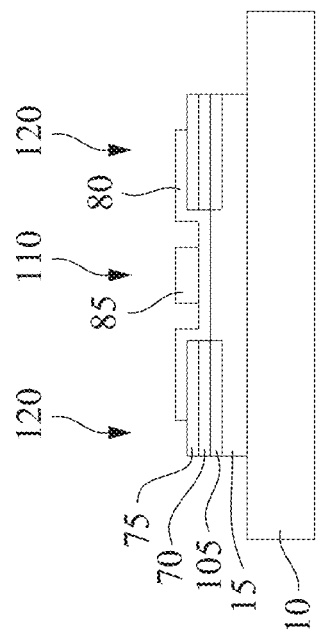

FIGS. 7A and 7B are an isometric view and a cross-sectional view of a stage of a sequential method of fabricating a semiconductor device according to an embodiment of the disclosure. As shown in FIGS. 7A and 7B, a gate dielectric layer 80 is subsequently formed over the 2D layer 15, and a gate electrode layer 85 is formed over the gate dielectric layer in the channel region 110 of the semiconductor device. The semiconductor device illustrated in FIGS. 7A and 7B is a top gate device. As shown, the channel region 110 is located between an opposing pair of source/drain regions 120.

In some embodiments, gate dielectric layer 80 is an oxide layer, such as silicon dioxide. In other embodiments, the gate dielectric layer 80 is one or more layers of a silicon nitride or a high-k dielectric layer. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 80 may be formed by chemical vapor deposition (CVD), atomic layer deposition (ALD), or any suitable method. The thickness of the gate dielectric layer 80 is in a range from about 1 nm to about 10 nm in some embodiments.

The gate electrode 85 can be formed of any suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrode 85 may be formed by chemical vapor deposition (CVD), atomic layer deposition (ALD), physical vapor deposition (PVD) (sputtering), electroplating, or other suitable method.

Figure 8:
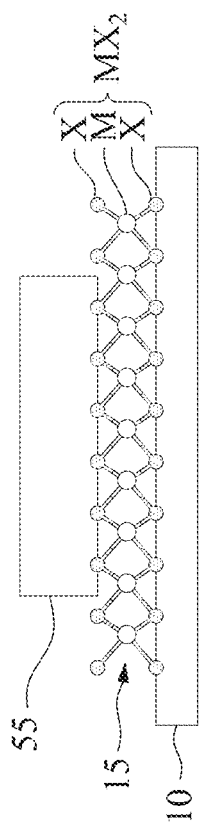
FIG. 8 is a schematic cross-sectional view of a stage of a sequential method of fabricating a semiconductor device according to an embodiment of the disclosure.

Embodiments of the present disclosure will be described in more detail with reference to FIGS. 8 to 12. As shown in FIG. 8, a metal dichalcogenide layer 15 is formed over a substrate 10. The metal dichalcogenide comprises a metal M and chalcogen X. A patterned buffer layer 55 is formed over the metal dichalcogenide layer 15 exposing portions of the metal dichalcogenide layer 15.

Figure 9:
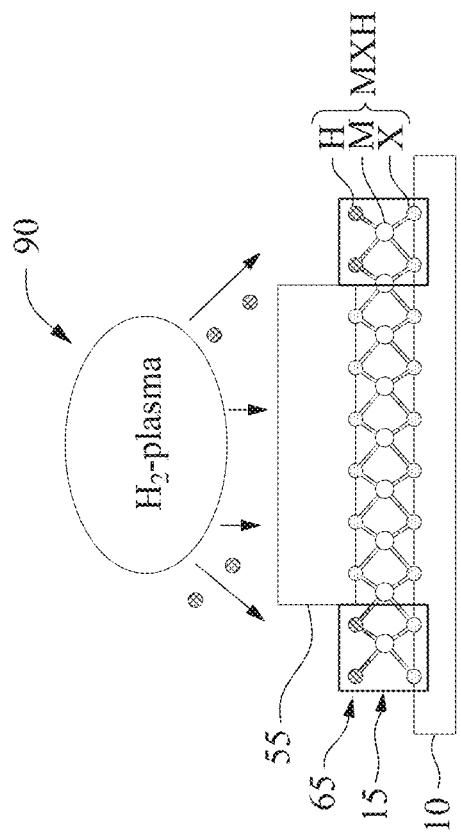
FIG. 9 is a schematic cross-sectional view of a stage of a sequential method of fabricating a semiconductor device according to an embodiment of the disclosure.

Then a hydrogen plasma 90 is applied to the exposed portions of the metal dichalcogenide layer 15, as shown in FIG. 9. The hydrogen plasma is applied at the range of power and pressure previously discussed herein. As shown, the hydrogen replaces the chalcogen in the surface portion 65 of the metal dichalcogenide film to form a metal chalcogenide hydride MXH.

Figure 11:
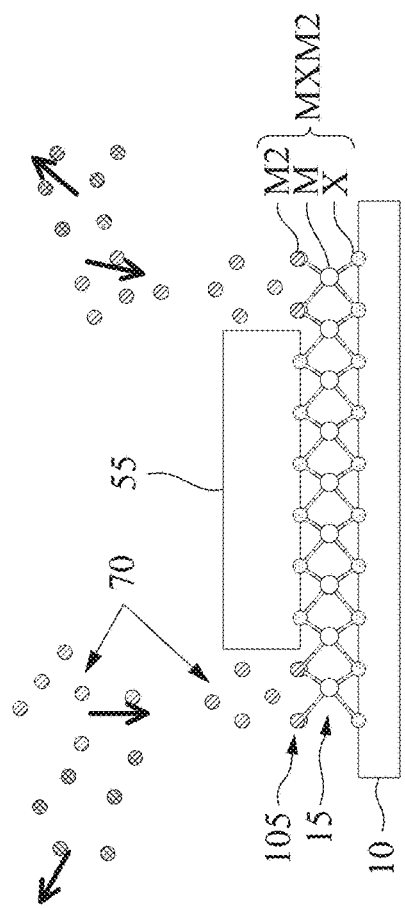
FIG. 11 is a schematic cross-sectional view of a stage of a sequential method of fabricating a semiconductor device according to an embodiment of the disclosure.
Figure 10:
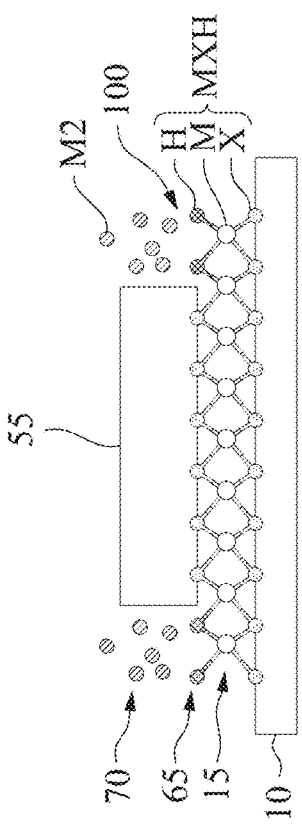
FIG. 10 is a schematic cross-sectional view of a stage of a sequential method of fabricating a semiconductor device according to an embodiment of the disclosure.

FIG. 10 shows the formation of a metal layer 70 over the exposed portion of the metal chalcogenide film, and the presence of van der Waals gap 100 between the metal layer and the metal chalcogenide film 15. In embodiments of the present disclosure, the van der Waals gap is eliminated and a lower resistance interface between the source/drain regions of the semiconductor device and metal contacts are provided because the metal layer 70 is chemically bonded directly to the metal chalcogenide film 15. As shown in FIG. 11, the reactive metal of the metal layer 70 replaces the hydrogen 90 of the MXH film forming a film MXM2 having an alloy bond region 105 where the metal layer 70 is directly bonded to the metal chalcogenide film MX.

In some embodiments, a second metal layer 75 is deposited over the first metal layer 70, as shown in FIG. 12. The second metal layer 75 is less reactive than the first metal layer 70 and protects the first metal layer 70 from oxidation. In some embodiments, the second metal layer 75 forms an alloy bond with the first metal layer 70 at the interface of the first and second metal layers.

In some embodiments, the semiconductor device is a 2D crystal heterostructure. Methods of forming a 2D crystal heterostructure according to embodiments of the disclosure is described with reference to FIGS. 13A to 18B. 2D crystal heterostructures provide semiconductor devices with increased drain current and field-effect mobility than single monolayer devices in some embodiments.

Figure 13A:
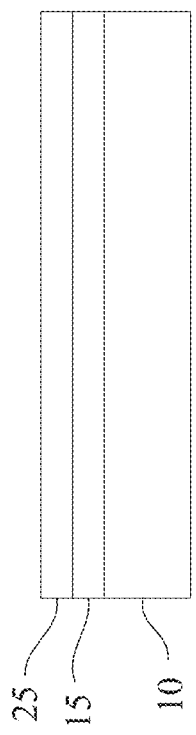
FIGS. 13A and 13B are a plan view and a cross-sectional view of a stage of a sequential method of fabricating a semiconductor device according to an embodiment of the disclosure.
Figure 13B:
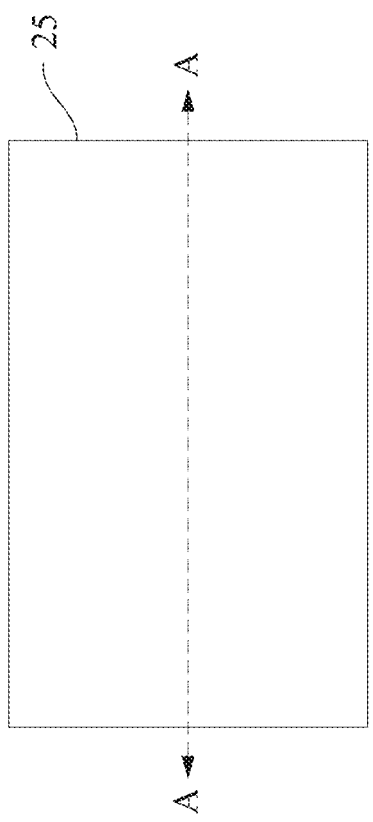

FIGS. 13A and 13B are a plan view and a cross-sectional view of a stage of a sequential method of fabricating a semiconductor device according to an embodiment of the disclosure. As shown in FIGS. 13A and 13B, a metal dichalcogenide hetero-structure includes a first metal dichalcogenide film 15 formed on a substrate 10 and a second metal dichalcogenide film 25 formed on the first metal dichalcogenide film 15. The first metal dichalcogenide film 15 and second metal dichalcogenide film 25 are formed by chemical vapor deposition (CVD) in some embodiments. In other embodiments, a first metal film is formed by physical vapor deposition (sputtering) or atomic layer deposition (ALD) and then the first metal film is converted to a metal chalcogenide by reacting the metal film with a chalcogen. The second metal chalcogenide film 25 is subsequently formed over the first metal dichalcogenide film 15 by forming a second metal film by physical vapor deposition (sputtering) or atomic layer deposition (ALD) and then the second metal film is converted to a metal dichalcogenide by reacting the second metal film with a chalcogen in some embodiments. The first metal dichalcogenide film 15 and the second metal dichalcogenide film 25 each have a thickness of about 0.5 nm to about 10 nm in some embodiments. In certain embodiments, one or both of the first and second metal dichalcogenide films 15, 25 are monolayer films. In some embodiments, the first and second metal dichalcogenides are different transition metal dichalcogenides. In some embodiments, the transition metal dichalcogenides are selected from the group consisting of $MoS_2$, $WS_2$, $PdS_2$, $HfS_2$, $MoSe_2$, $WSe_2$, $PdSe_2$, $HfSe_2$, $MoTe_2$, $WTe_2$, $PdTe_2$, and $HfTe_2$. In certain embodiments, a $WS_2/MoS_2$ heterostructure including a $MoS_2$ film, as film 15, formed on a sapphire substrate, and a $WS_2$ film, as film 25, formed on the $MoS_2$ film is provided.

Figure 14A:
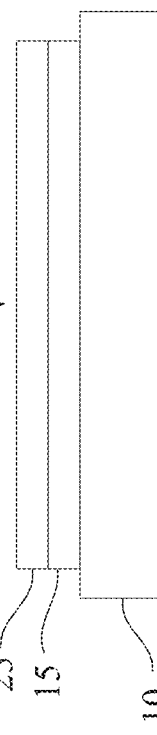
FIGS. 14A and 14B are a plan view and a cross-sectional view of a stage of a sequential method of fabricating a semiconductor device according to an embodiment of the disclosure.
Figure 14B:
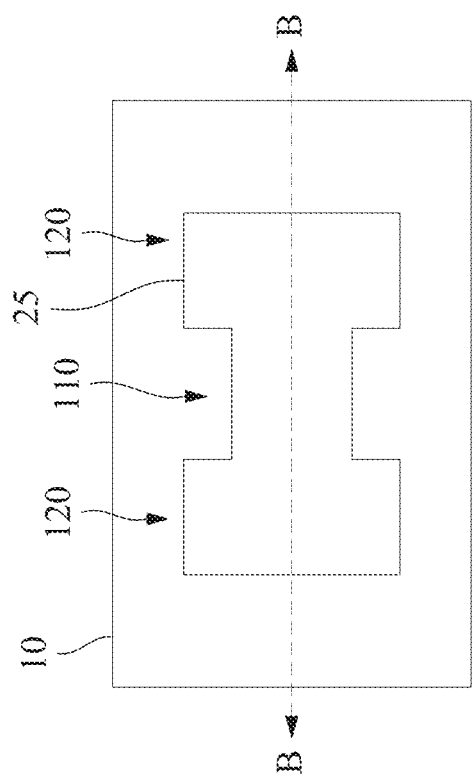

FIGS. 14A and 14B are a plan view and a cross-sectional view of a stage of a sequential method of fabricating a semiconductor device according to an embodiment of the disclosure. Using photolithographic and etching operations the first and second metal dichalcogenide films 15, 25 are patterned to form a channel region 110 and source/drain regions 120, as shown in FIGS. 14A and 14B. The photolithographic and etching operations expose the substrate 10 surrounding the patterned first and second metal dichalcogenide films 15, 25.

Figure 15A:
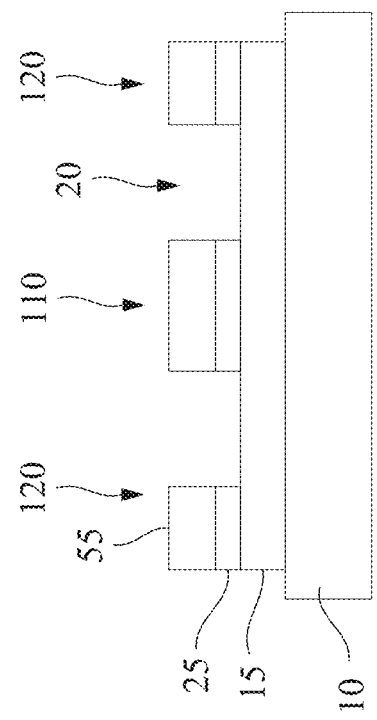
FIGS. 15A and 15B are a plan view and a cross-sectional view of a stage of a sequential method of fabricating a semiconductor device according to an embodiment of the disclosure.
Figure 15B:
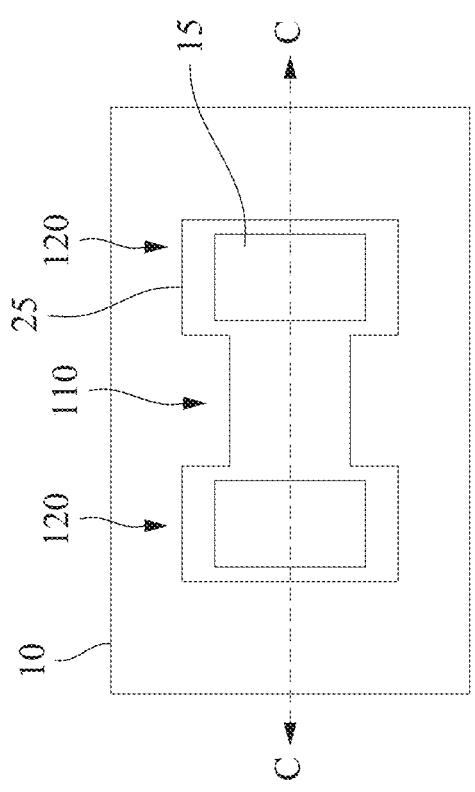

FIGS. 15A and 15B are a plan view and a cross-sectional view of a stage of a sequential method of fabricating a semiconductor device according to an embodiment of the disclosure. A buffer layer 55 is formed over the second metal dichalcogenide layer 25, as shown in FIGS. 15A and 15B. As previously discussed, the buffer layer 55 can be a photoresist layer or oxide layer. Using suitable photolithographic and etching operations, contact window openings 20 are formed in the buffer layer 55 and the second metal dichalcogenide film 25 exposing the first metal dichalcogenide film 15, as shown in FIGS. 15A and 15B.

Figure 16:
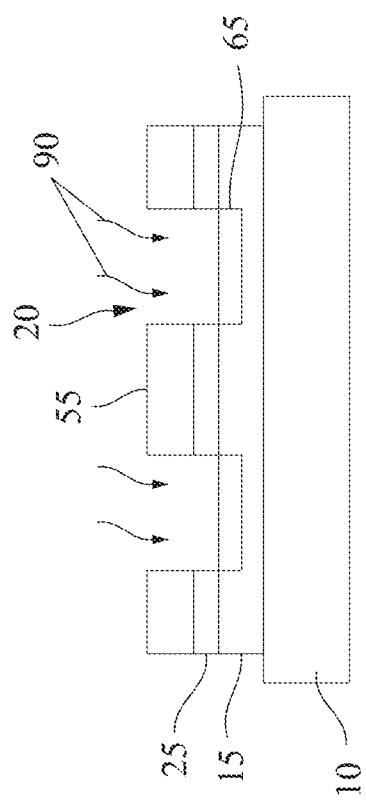
FIG. 16 is a cross-sectional view of a stage of a sequential method of fabricating a semiconductor device according to an embodiment of the disclosure.

Then the plasma 90 is applied to portions of the exposed first dichalcogenide layer 15, as shown in FIG. 16. As previously discussed, the plasma 90 interacts with the exposed portions of the metal dichalcogenide layer 15. In some embodiments, the plasma is a hydrogen plasma. The chalcogen is removed at a surface portion 65 of the metal dichalcogenide and replaced with hydrogen to form a metal chalcogenide hydride, MXH. In some embodiments, the plasma is applied at a pressure ranging from about 10 mTorr to about 500 mTorr. In some embodiments, the plasma is applied at a pressure ranging from about 20 mTorr to about 300 mTorr, in other embodiments, the plasma is applied at a pressure ranging from about 50 mTorr to about 200 mTorr. In some embodiments, the plasma is applied at a power ranging from about 10 W to about 150 W. In some embodiments, the plasma is applied at a power ranging from about 20 W to about 100 W, in other embodiments, the plasma is applied at a power ranging from about 30 W to about 50 W.

Figure 17B:
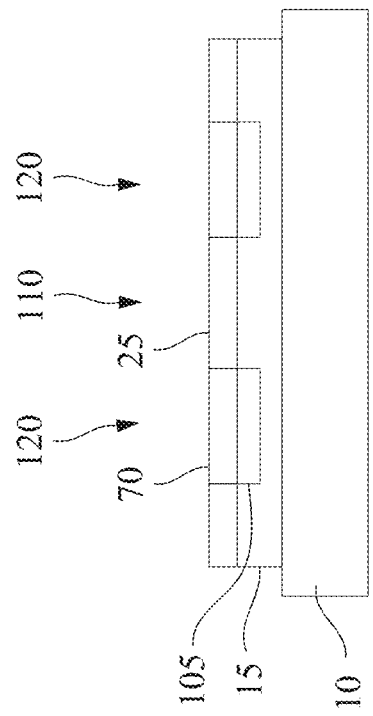
FIGS. 17A and 17B are a plan view and a cross-sectional view of a stage of a sequential method of fabricating a semiconductor device according to an embodiment of the disclosure.
Figure 17A:
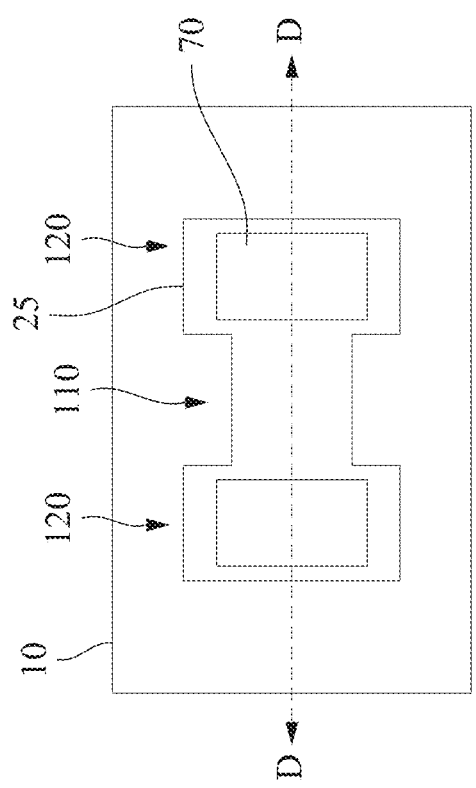

FIGS. 17A and 17B are a plan view and a cross-sectional view of a stage of a sequential method of fabricating a semiconductor device according to an embodiment of the disclosure. After the buffer layer 55 is removed in some embodiments, a metal layer 70 is formed over the exposed first metal dichalcogenide layer 15 in the contact window openings 20, as shown in FIGS. 17A and 17B, to form source/drain contacts. As previously described, the metal layer removes the hydrogen from the MXH film and replaces the hydrogen with the metal forming a film MXM2, where M is the metal of the metal chalcogenide film, X is the chalcogen, and M2 is a reactive metal. In some embodiments, the reactive metal forms an alloy with the metal of the metal chalcogenide film to form an alloy layer 105. In some embodiments, the reactive metal is one or more selected from the group of consisting of Ni, Mo, In, Ti, W, Sc, Pd, Pt, Co, and Ru.

In an embodiment, the metal layer 70 is formed at a temperature ranging from 100° C. to 300° C. or the device is heated to a temperature ranging from 100° C. to 300° C. (or annealed at a temperature ranging from 100° C. to 300° C.) after forming the metal layer 70.

In some embodiments, a second metal layer is formed over the first metal layer 70 (not shown in FIGS. 17A and 17B). The second metal layer is made of a third metal that is less reactive than the second metal. In some embodiments, the second metal layer is made of Au, Pt, Cu, or TiN.

As shown in FIGS. 18A and 18B, a gate dielectric layer 80 is subsequently formed over the metal layer 70, the second metal chalcogenide film 25, the first metal chalcogenide film 15, and the substrate 10. A gate electrode layer 85 is then formed over the dielectric layer 80 and source/drain electrodes are formed connecting to the first metal layer 70 to form a top-gated hetero-structure transistor.

In some embodiments, the gate dielectric layer 80 is a silicon oxide, such as silicon dioxide. In other embodiments, the gate dielectric layer 80 is one or more layers of a silicon nitride or a high-k dielectric layer. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 80 may be formed by chemical vapor deposition (CVD), atomic layer deposition (ALD), or any suitable method.

The gate electrode 85 can be formed of any suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrode 85 may be formed by chemical vapor deposition (CVD), atomic layer deposition (ALD), physical vapor deposition (PVD) (sputtering), electroplating, or other suitable method.

Figure 19:
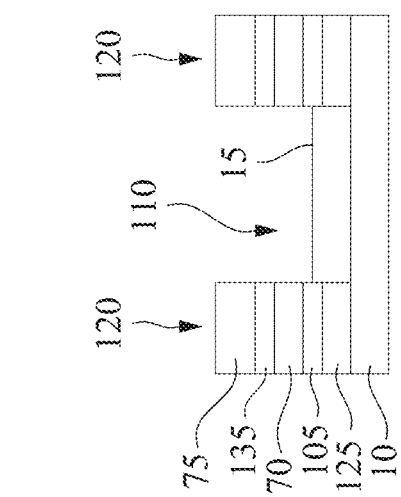
FIG. 19 is a schematic cross-sectional view of a semiconductor device according to an embodiment of the disclosure.

FIG. 19 is a schematic cross-sectional view of a semiconductor device according to an embodiment of the disclosure. In some embodiments, the channel region 110 includes a single metal dichalcogenide monolayer film 15. The source/drain regions 120 include a metal chalcogenide monolayer film MX 125, including a metal M and a chalcogen X except oxygen; an alloy layer 105, including an alloy of the first metal layer 70 and the metal chalcogen monolayer film 125; the first metal layer 70; an alloy layer 135, including an alloy of the first metal layer 70 and the second metal layer 75; and the second metal layer 75.

Figure 20:
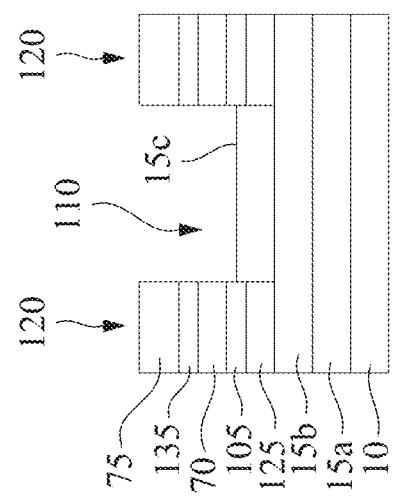
FIG. 20 is a schematic cross-sectional view of a semiconductor device according to an embodiment of the disclosure.

FIG. 20 is a schematic cross-sectional view of a semiconductor device according to an embodiment of the disclosure. In some embodiments, the channel region 110 includes a plurality of metal dichalcogenide monolayer films 15a, 15b, 15c. The source/drain regions 120 include a plurality of metal dichalcogenide monolayer films 15a, 15b; a metal chalcogenide monolayer film MX 125, including a metal M and a chalcogen X except oxygen; an alloy layer 105, including an alloy of the first metal layer 70 and the metal chalcogen monolayer film 125; the first metal layer 70; an alloy layer 135, including an alloy of the first metal layer 70 and the second metal layer 75; and the second metal layer 75. The number of metal dichalcogenide films in the channel region 110 is not limited to three, as shown, but can be four or more metal dichalcogenide films.

Figure 21:
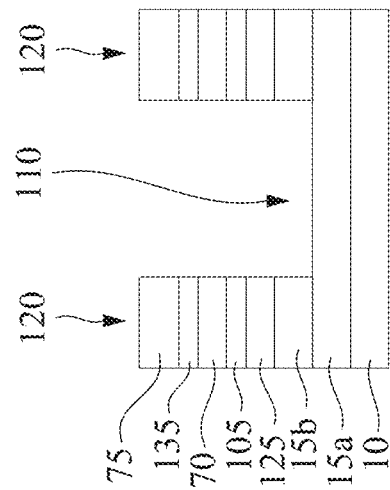
FIG. 21 is a schematic cross-sectional view of a semiconductor device according to an embodiment of the disclosure.

FIG. 21 is a schematic cross-sectional view of a semiconductor device according to an embodiment of the disclosure. In some embodiments, the channel region 110 includes a single metal dichalcogenide monolayer film 15a.

The source/drain regions 120 include a plurality of metal dichalcogenide monolayer films 15a, 15b; a metal chalcogenide monolayer film MX 125, including a metal M and a chalcogen X except oxygen; an alloy layer 105, including an alloy of the first metal layer 70 and the metal chalcogen monolayer film 125; the first metal layer 70; an alloy layer 135, including an alloy of the first metal layer 70 and the second metal layer 75; and the second metal layer 75. The number of metal dichalcogenide films in the source/drain regions 120 is not limited to two, as shown, but can be three or more metal dichalcogenide films.

Figure 22:
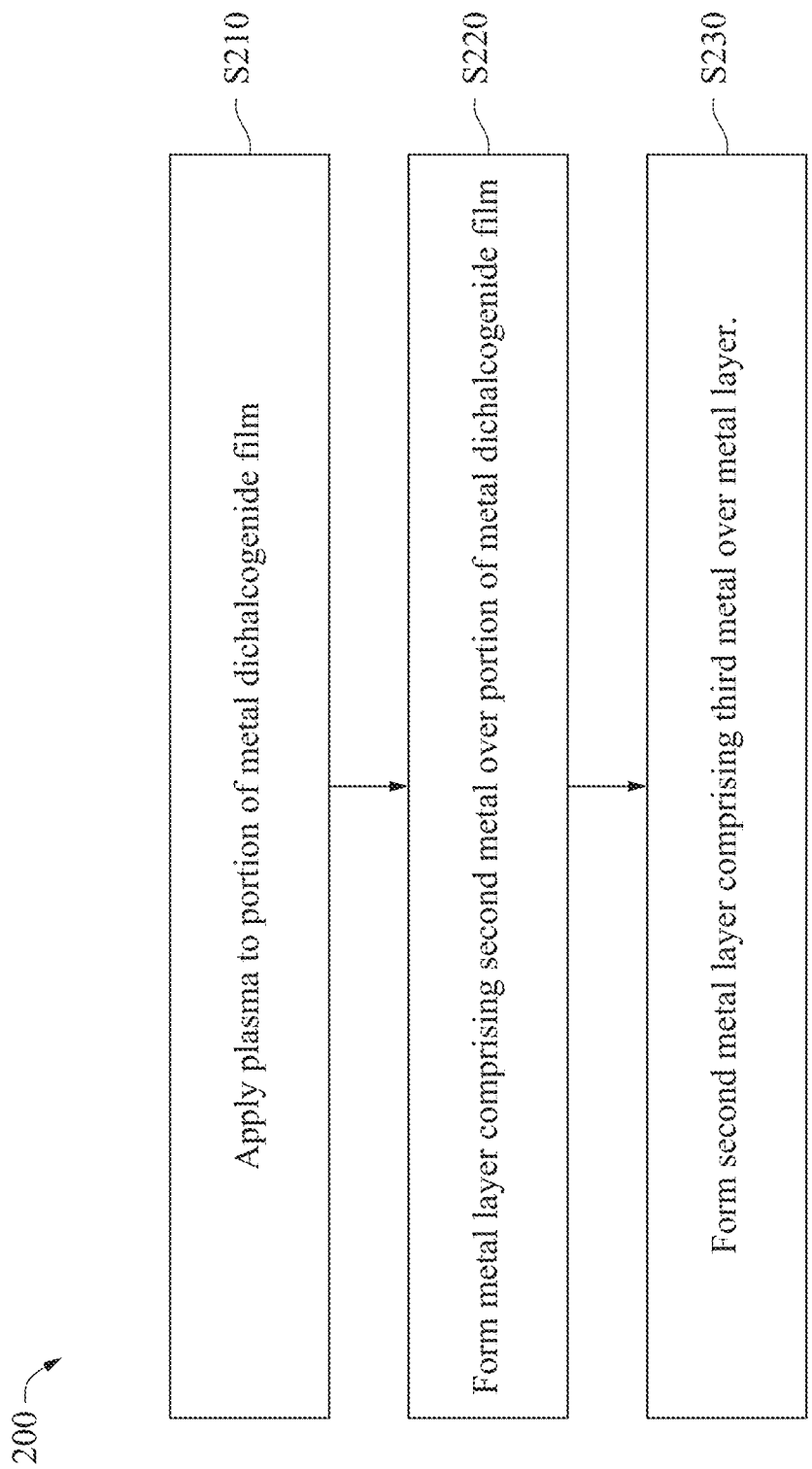
FIG. 22 is a flowchart illustrating a method of fabricating a semiconductor device according to an embodiment of the disclosure.

FIG. 22 is a flowchart illustrating a method 200 of fabricating a semiconductor device according to an embodiment of the disclosure. The method 200 includes an operation S210 of applying a plasma 90 to a portion of a metal dichalcogenide film 15. In some embodiments, the metal dichalcogenide film 15 includes a first metal and a chalcogen selected from the group consisting of S, Se, Te, and combinations thereof. In operation S220, a metal layer 70 including a second metal is formed over the portion of the metal dichalcogenide film 15 after applying the plasma 90. The plasma 90 is a hydrogen plasma in some embodiments. In some embodiments, the method includes an operation S230 of forming a second metal layer 75 including a third metal over the metal layer 70.

Figure 23:
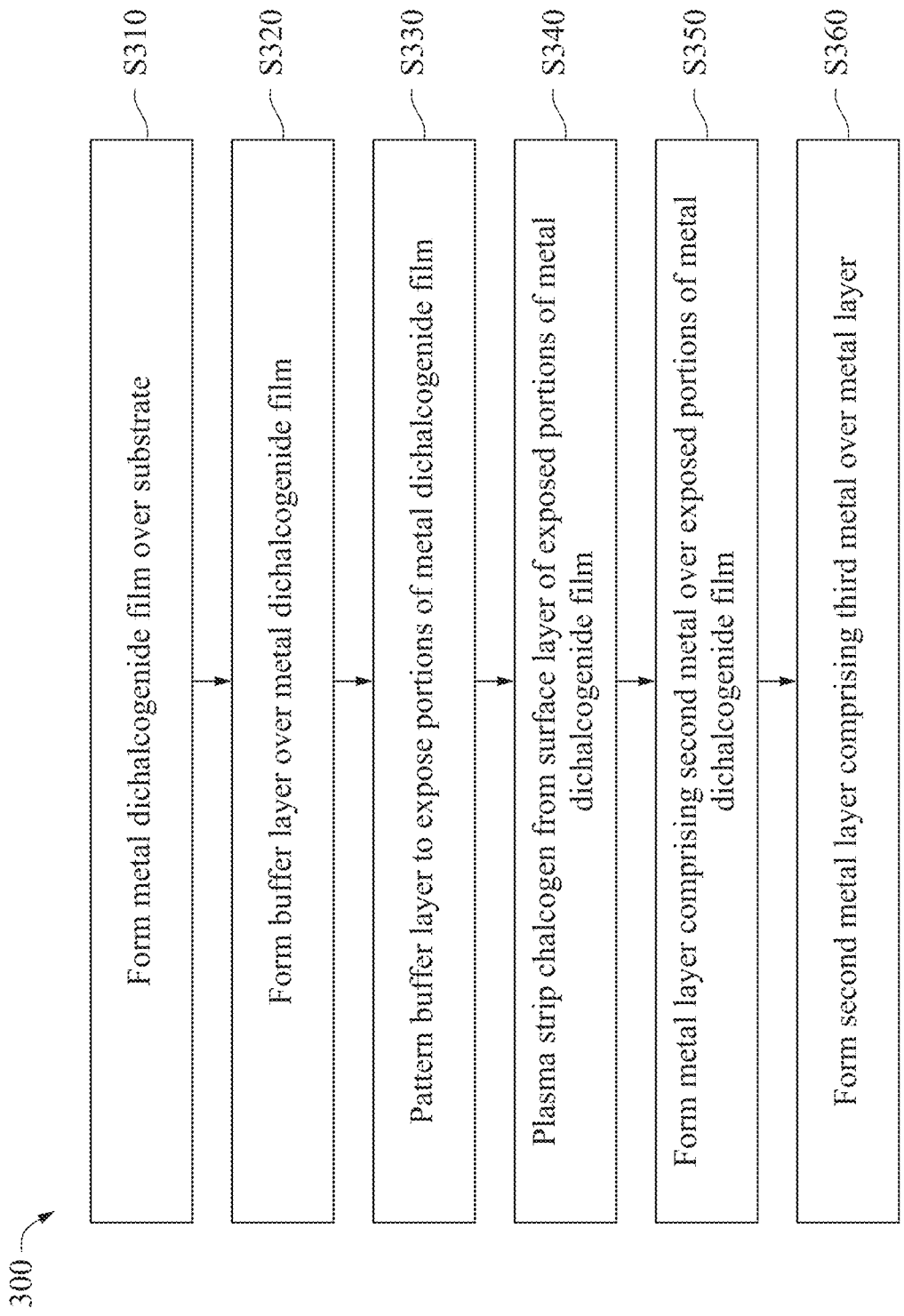
FIG. 23 is a flowchart illustrating a method of fabricating a semiconductor device according to an embodiment of the disclosure.

FIG. 23 is a flowchart illustrating a method 300 of fabricating a semiconductor device according to an embodiment of the disclosure. The method 300 includes an operation S310 of forming a metal dichalcogenide film 15 over a substrate 10. In some embodiments, the metal dichalcogenide film 15 includes a first metal and a chalcogen selected from the group consisting of S, Se, Te, and combinations thereof. A buffer layer 55 is subsequently formed over the metal dichalcogenide film 15 in operation S320, and the buffer layer 55 is patterned to expose portions of the metal dichalcogenide film 15 in operation S330. Then, the chalcogen is plasma stripped from a surface layer 65 of the exposed portions of the metal dichalcogenide film 15 in operation S340. In operation S350, a metal layer 70 including a second metal is formed over the exposed portions of the metal dichalcogenide film 15 after the plasma stripping. In some embodiments, the plasma stripping is performed at a plasma pressure ranging from 10 mTorr to 500 mTorr, and a power ranging from 10 W to 150 W. In some embodiments, second metal layer 75 including a third metal is formed over the metal layer 70 in operation S360. The third metal is less reactive than the second metal.

Figure 24:
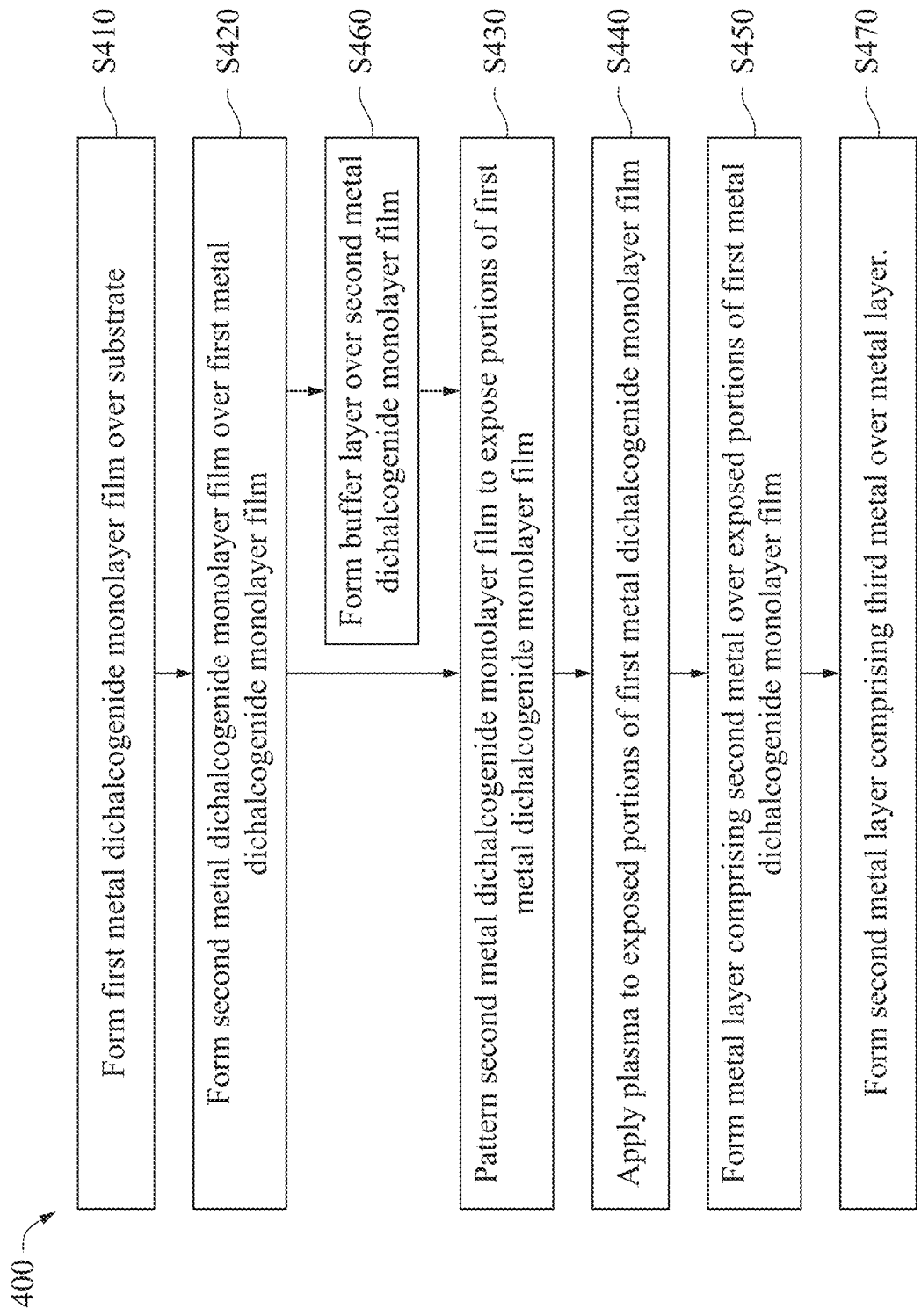
FIG. 24 is a flowchart illustrating a method of fabricating a semiconductor device according to an embodiment of the disclosure.

FIG. 24 is a flowchart illustrating a method 400 of fabricating a semiconductor device according to an embodiment of the disclosure. The method includes an operation S410 of forming a first metal dichalcogenide monolayer film 15 over a substrate 10, and an operation S420 of forming a second metal dichalcogenide monolayer film 25 over the first metal dichalcogenide monolayer film 15. The first and second metal dichalcogenide films 15, 25 include a first metal and a chalcogen selected from the group consisting of S, Se, Te, and combinations thereof. In operation S430, the second metal dichalcogenide monolayer film 25 is patterned to expose portions of the first metal dichalcogenide monolayer film 15. A plasma 90 is subsequently applied to the exposed portions of the first metal dichalcogenide monolayer film 15 in operation S440. Then, in operation S450, a metal layer 70 including a second metal is formed over the exposed portions of the first metal dichalcogenide monolayer film 15 after applying the plasma 90. In some embodiments, the method 400 includes an operation S460 of forming a buffer layer 55 over the second metal dichalcogenide monolayer film 25 before patterning the second dichalcogenide monolayer. In some embodiments, the method 400 includes an operation S470 of forming a second metal layer 75 comprising a third metal over the metal layer 70.

Figure 25:
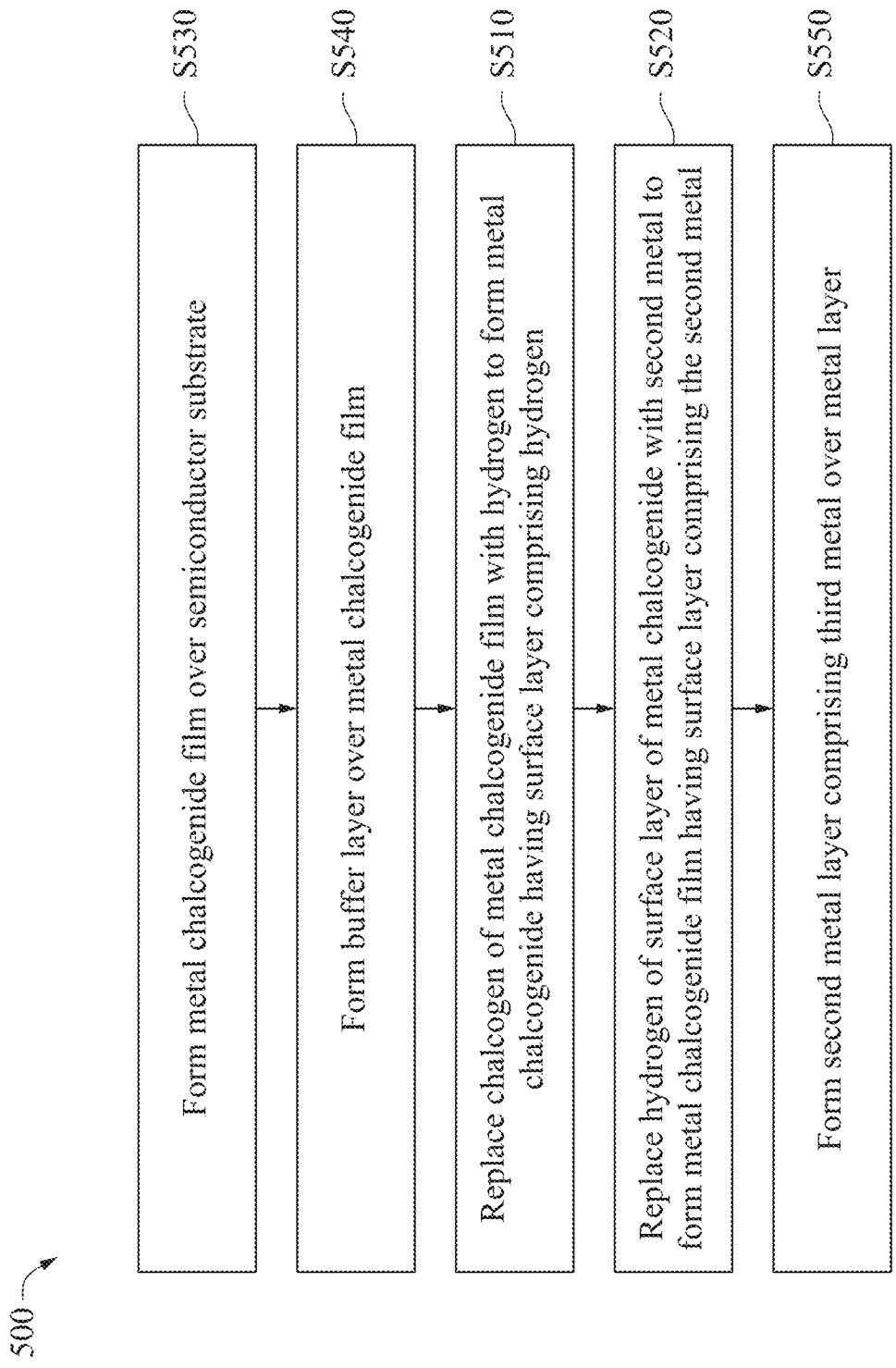
FIG. 25 is a flowchart illustrating a method of fabricating a semiconductor device according to an embodiment of the disclosure.

FIG. 25 is a flowchart illustrating a method 500 of fabricating a semiconductor device according to an embodiment of the disclosure. The method 500 includes an operation S510 of replacing chalcogen of a metal chalcogenide film 15 with hydrogen to form a metal chalcogenide having a surface layer comprising hydrogen. The metal chalcogenide film 15 includes a first metal and a chalcogen selected from the group consisting of S, Se, Te, and combinations thereof. Then, in operation S520, the hydrogen of the surface layer 65 of the metal chalcogenide is replaced with the second metal to form a metal chalcogenide film having a surface layer 105 including the second metal. In some embodiments, the method 500 includes an operation S530 of forming the metal chalcogenide film 15 over a semiconductor substrate 10 before replacing the chalcogen. In some embodiments, the method 500 includes an operation S540 forming a buffer layer 55 over the metal chalcogenide film 15 before replacing the chalcogen. In some embodiments, the replacing the chalcogen of the metal chalcogenide film with hydrogen includes applying a hydrogen plasma 90 to the metal chalcogenide film 15. In some embodiments, the hydrogen plasma is applied at a plasma pressure ranging from 10 mTorr to 500 mTorr, and a power ranging from 10 W to 150 W. In some embodiments, the first metal is one or more selected from the group consisting of Mo, W, Pd, and Hf. In some embodiments, the second metal is one or more selected from the group consisting of Ni, Mo, In, Ti, W, Sc, Pd, Pt, Co, and Ru. In some embodiments, the method 500 includes an operation S550 of forming a second metal layer 75 comprising a third metal over the metal layer 70, wherein the third metal is less reactive than the second metal.

It is understood that the semiconductor devices undergo further fabrication processes to form various features such as contacts/vias, interconnect metal layers, dielectric layers, passivation layers, etc. Additional operations performed on the semiconductor device may include photolithography, etching, chemical-mechanical polishing, thermal treatments, including rapid thermal annealing, depositions, doping, including ion-implantation, photoresist ashing, and liquid solvent cleaning.

The metal-alloy interface structures according to the present disclosure, reduces defect formation at the interface, and prevents Fermi level pinning effects in some embodiments. The metal-alloy interface structures of the disclosure enable high current density through the metal to the channel. In embodiments to the disclosure, electron transport from the metal contact to the metal chalcogenide, $MX_2$, layer will not encounter any van der Waals gap. Therefore, the contact resistance is reduced by the seamless alloy-edge contact structure.

It will be understood that not all advantages have been necessarily discussed herein, no particular advantage is required for all embodiments or examples, and other embodiments or examples may offer different advantages.

An embodiment of the disclosure is a method of fabricating a semiconductor device including applying a plasma to a portion of a metal dichalcogenide film. The metal dichalcogenide film includes a first metal and a chalcogen selected from the group consisting of S, Se, Te, and combinations thereof. A metal layer including a second metal is formed over the portion of the metal dichalcogenide film after applying the plasma. In an embodiment, the plasma is a hydrogen plasma. In an embodiment, the pressure of the plasma ranges from 10 mTorr to 500 mTorr, and the plasma is applied at a power ranging from 10 W to 150 W. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the metal layer is formed at a temperature ranging from 100° C. to 300° C. or the device is heated to a temperature ranging from 100° C. to 300° C. after forming the metal layer. In an embodiment, the method includes forming a second metal layer including a third metal over the metal layer. In an embodiment, the third metal is less reactive than the second metal. In an embodiment, the third metal is one or more selected from the group consisting of Au, Pt, Cu, and TiN. In an embodiment, the second metal layer has a thickness ranging from 10 nm to 100 nm. In an embodiment, the first metal layer has a thickness ranging from 1 nm to 25 nm.

Another embodiment of the disclosure is a method of fabricating a semiconductor device, including forming a metal dichalcogenide film over a substrate, wherein the metal dichalcogenide film includes a first metal and a chalcogen selected from the group consisting of S, Se, Te, and combinations thereof. A buffer layer is formed over the metal dichalcogenide film. The buffer layer is patterned to expose portions of the metal dichalcogenide film. The chalcogen is plasma stripped from a surface layer of the exposed portions of the metal dichalcogenide film. A metal layer including a second metal is formed over the exposed portions of the metal dichalcogenide film after the plasma stripping. In an embodiment, the buffer layer is a photoresist layer or an oxide layer. In an embodiment, the plasma stripping includes replacing the chalcogen in the surface layer of the exposed portions of the metal dichalcogenide film with hydrogen. In an embodiment, the forming a metal layer includes replacing the hydrogen with the second metal. In an embodiment, the plasma stripping is performed at a plasma pressure ranging from 10 mTorr to 500 mTorr, and a power ranging from 10 W to 150 W. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the method includes forming a second metal layer comprising a third metal over the metal layer, wherein the third metal is less reactive than the second metal. In an embodiment, the third metal is one or more selected from the group consisting of Au, Pt, Cu, and TiN. In an embodiment, the second metal layer has a thickness ranging from 10 nm to 100 nm. In an embodiment, the first metal layer has a thickness ranging from 1 nm to 25 nm. In an embodiment, the metal dichalcogenide film comprises a metal dichalcogenide selected from the group consisting of $WS_2$, $MoS_2$, $WSe_2$, $MoSe_2$, $WTe_2$, and $MoTe_2$. In an embodiment, the substrate includes silicon, silicon oxide, or aluminum oxide.

Another embodiment of the disclosure is a method of fabricating a semiconductor device, including forming a first metal dichalcogenide monolayer film over a substrate, and forming a second metal dichalcogenide monolayer film over the first metal dichalcogenide monolayer film. The first and second metal dichalcogenide films include a first metal and a chalcogen selected from the group consisting of S, Se, Te, and combinations thereof. The second metal dichalcogenide monolayer film is patterned to expose portions of the first metal dichalcogenide monolayer film. A plasma is applied to the exposed portions of the first metal dichalcogenide monolayer film. A metal layer including a second metal is formed over the exposed portions of the first metal dichalcogenide monolayer film after applying the plasma. In an embodiment, the method includes forming a buffer layer over the second metal dichalcogenide monolayer film before patterning the second dichalcogenide monolayer. In an embodiment, the plasma is a hydrogen plasma. In an embodiment, the pressure of the plasma ranges from 10 mTorr to 500 mTorr, and the plasma is applied at a power ranging from 10 W to 150 W. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the metal layer is formed at a temperature ranging from 100° C. to 300° C. or the device is heated to a temperature ranging from 100° C. to 300° C. after forming the metal layer. In an embodiment, the method includes forming a second metal layer comprising a third metal over the metal layer. In an embodiment, the third metal is less reactive than the second metal. In an embodiment, the third metal is one or more selected from the group consisting of Au, Pt, Cu, and TiN.

Another embodiment is a method of fabricating a semiconductor device, including forming a first metal dichalcogenide monolayer film over a substrate, and forming a second metal dichalcogenide monolayer film over the first metal dichalcogenide monolayer film. The first and second metal dichalcogenide films include a first metal and a chalcogen selected from the group consisting of S, Se, Te, and combinations thereof. A first portion of the second metal dichalcogenide monolayer film is removed to expose a first portion of the first metal dichalcogenide monolayer film. A plasma is applied to second portions of the second metal dichalcogenide monolayer film. A metal layer comprising a second metal is formed over the second portions of the second metal dichalcogenide monolayer film after applying the plasma. In an embodiment, the first portion of the first metal dichalcogenide monolayer film is a channel region of the semiconductor device. In an embodiment, the second portions of the second metal dichalcogenide monolayer film are source/drain regions of the semiconductor device. In an embodiment, the plasma is a hydrogen plasma. In an embodiment, the pressure of the plasma ranges from 10 mTorr to 500 mTorr, and the plasma is applied at a power ranging from 10 W to 150 W. In an embodiment, the first metal and second metal are different metals. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the metal layer is formed at a temperature ranging from 100° C. to 300° C. or the device is heated to a temperature ranging from 100° C. to 300° C. after forming the metal layer. In an embodiment, the method includes forming a second metal layer comprising a third metal over the metal layer. In an embodiment, the third metal is less reactive than the second metal. In an embodiment, the third metal is one or more selected from the group consisting of Au, Pt, Cu, and TiN.

Another embodiment of the disclosure is a method of fabricating a semiconductor device including replacing chalcogen of a metal chalcogenide film with hydrogen to form a metal chalcogenide having a surface layer comprising hydrogen. The metal chalcogenide film includes a first metal and a chalcogen selected from the group consisting of S, Se, Te, and combinations thereof. The hydrogen of the surface layer of the metal chalcogenide is replaced with the second metal to form a metal chalcogenide film having a surface layer including the second metal. In an embodiment, the method includes forming the metal chalcogenide film over a semiconductor substrate before replacing the chalcogen. In an embodiment, the method includes forming a buffer layer over the metal chalcogenide film before replacing the chalcogen. In an embodiment, the buffer layer is a photoresist layer or an oxide layer. In an embodiment, the oxide layer includes a silicon oxide or an aluminum oxide. In an embodiment, the replacing the chalcogen of the metal chalcogenide film with hydrogen includes applying a hydrogen plasma to the metal chalcogenide film. In an embodiment, the hydrogen plasma is applied at a plasma pressure ranging from 10 mTorr to 500 mTorr, and a power ranging from 10 W to 150 W. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the method includes forming a second metal layer comprising a third metal over the metal layer, wherein the third metal is less reactive than the second metal.

Another embodiment of the disclosure is a method of fabricating a semiconductor device, including forming a metal dichalcogenide film over a substrate, wherein the metal dichalcogenide film includes a first metal and a chalcogen selected from the group consisting of S, Se, Te, and combinations thereof. A buffer layer is formed over the metal dichalcogenide film. The buffer layer is patterned to expose portions of the metal dichalcogenide film. The chalcogen in a surface layer of the exposed portions of the metal dichalcogenide film is replaced with hydrogen, and the hydrogen in the surface layer of the exposed portions of the metal dichalcogenide film is replaced with a second metal different from the first metal. In an embodiment, the buffer layer is a photoresist layer or an oxide layer. In an embodiment, the oxide layer includes a silicon oxide or an aluminum oxide. In an embodiment, the replacing chalcogen in the surface layer of the exposed portions of the metal dichalcogenide film with hydrogen includes applying a hydrogen plasma to the metal dichalcogenide film. In an embodiment, the hydrogen plasma is applied at a plasma pressure ranging from 10 mTorr to 500 mTorr, and a power ranging from 10 W to 150 W. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the method includes forming a second metal layer comprising a third metal over the metal layer, wherein the third metal is less reactive than the second metal. In an embodiment, the third metal is selected from the group consisting of Au, Pt, Cu, and TiN.

Another embodiment of the disclosure is a semiconductor device, including a metal chalcogenide monolayer film disposed over a substrate, wherein the metal chalcogenide monolayer film includes a first metal and a chalcogen selected from the group consisting of S, Se, Te, and combinations thereof. The metal chalcogenide monolayer film has a first surface portion and a second surface portion. A metal layer is disposed over the metal chalcogenide film, wherein the metal layer comprises a second metal. The metal layer is disposed over the first surface portion and not over the second surface portion, and the metal layer is chemically bonded to the metal chalcogenide film. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, a second metal layer including a third metal is disposed over the metal layer. In an embodiment, the third metal is less reactive than the second metal. In an embodiment, the third metal is one or more selected from the group consisting of Au, Pt, Cu, and TiN. In an embodiment, the second metal layer has a thickness ranging from 10 nm to 100 nm. In an embodiment, the first metal layer has a thickness ranging from 1 nm to 25 nm. In an embodiment, the metal dichalcogenide film includes W or Mo. In an embodiment, the substrate includes silicon, silicon oxide, or aluminum oxide.

Another embodiment of the disclosure is a semiconductor device, including a first metal chalcogenide monolayer film disposed over a substrate. A second metal chalcogenide monolayer film is disposed over the first metal chalcogenide monolayer film. The first and second metal chalcogenide monolayer films each include a first metal and a chalcogen selected from the group consisting of S, Se, Te, and combinations thereof. The second metal chalcogenide monolayer film is patterned so that portions of the first metal chalcogenide monolayer film are exposed through patterned portions of the second metal chalcogenide monolayer film. A metal layer is disposed over portions of the first metal chalcogenide monolayer film exposed through the second metal chalcogenide monolayer film, wherein the metal layer comprises a second metal, and the metal layer is chemically bonded to the first metal chalcogenide monolayer film. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the semiconductor device includes a second metal layer comprising a third metal disposed over the metal layer. In an embodiment, the third metal is less reactive than the second metal. In an embodiment, the third metal is one or more selected from the group consisting of Au, Pt, Cu, and TiN. In an embodiment, the second metal layer has a thickness ranging from 10 nm to 100 nm. In an embodiment, the first metal layer has a thickness ranging from 1 nm to 25 nm.

Another embodiment of the disclosure is a semiconductor device, including a channel region disposed over a first region of a semiconductor substrate, wherein the channel region includes one or more metal dichalcogenide monolayers. Source/drain regions are disposed over a second region of the semiconductor substrate, wherein the second regions of the semiconductor substrate are on opposing sides of the first region of the semiconductor substrate. The source/drain regions include one or more metal chalcogenide monolayers. Each of the metal chalcogenide monolayers include the first metal and a chalcogen selected from the group consisting of S, Se, Te, and combinations thereof. A metal layer including a second metal is disposed over the source/drain regions, and the metal layer is chemically bonded to the metal chalcogenide film in the second region. In an embodiment, the first metal is one or more selected from the group consisting of Mo, W, Pd, and Hf. In an embodiment, the second metal is one or more selected from the group consisting of Ni, Mo, In, Ti, W, Sc, Pd, Pt, Co, and Ru. In an embodiment, the semiconductor device includes a second metal layer including a third metal disposed over the metal layer. In an embodiment, the third metal is less reactive than the second metal. In an embodiment, the third metal is one or more selected from the group consisting of Au, Pt, Cu, and TiN. In an embodiment, the second metal layer has a thickness ranging from 10 nm to 100 nm. In an embodiment, the first metal layer has a thickness ranging from 1 nm to 25 nm. In an embodiment, the channel region is formed of a single metal dichalcogenide monolayer, and the source/drain regions include two or more metal chalcogenide monolayers. In an embodiment, the channel region is formed of two or more metal dichalcogenide monolayers, and the source/drain regions are formed of a single metal chalcogenide monolayer. In an embodiment, the metal dichalcogenide films include a metal dichalcogenide selected from the group consisting of $WS_2$, $MoS_2$, $WSe_2$, $MoSe_2$, $WTe_2$, and $MoTe_2$. In an embodiment, the semiconductor substrate includes silicon, silicon oxide, or aluminum oxide. In an embodiment, the metal dichalcogenide films have a thickness of 0.5 nm to 10 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    applying a plasma to a portion of a metal dichalcogenide film,
    wherein the metal dichalcogenide film comprises a first metal and a chalcogen selected from the group consisting of S, Se, Te, and combinations thereof;
    forming a first metal layer over the portion of the metal dichalcogenide film and in contact with the metal dichalcogenide film after applying the plasma,
    wherein the first metal layer is a layer of one or more second metals selected from the group consisting of Ni, Mo, In, Ti, W, Sc, Pd, Pt, Co, and Ru; and
    forming a second metal layer comprising a third metal over the first metal layer,
    wherein the third metal is less reactive than the one or more second metals.

2. The method according to claim 1, wherein the plasma is a hydrogen plasma.

3. The method according to claim 1, wherein the pressure of the plasma ranges from 10 mTorr to 500 mTorr, and the plasma is applied at a power ranging from 10 W to 150 W.

4. The method according to claim 1, wherein the first metal is one or more selected from the group consisting of Mo, W, Pd, and Hf.

5. The method according to claim 1, wherein the metal layer is formed at a temperature ranging from 100° C. to 300° C. or the device is heated to a temperature ranging from 100° C. to 300° C. after forming the metal layer.

6. The method according to claim 1, wherein the third metal is one or more selected from the group consisting of Au, Pt, Cu, and TiN.

7. The method according to claim 1, wherein the second metal layer has a thickness ranging from 10 nm to 100 nm.

8. The method according to claim 1, wherein the first metal layer has a thickness ranging from 1 nm to 25 nm.

9. A method of fabricating a semiconductor device, comprising:
    forming a metal dichalcogenide film over a substrate,
    wherein the metal dichalcogenide film comprises a first metal and a chalcogen selected from the group consisting of S, Se, Te, and combinations thereof;
    forming a buffer layer over the metal dichalcogenide film;
    patterning the buffer layer to expose portions of the metal dichalcogenide film;
    plasma stripping the chalcogen from a surface layer of the exposed portions of the metal dichalcogenide film;
    forming a first metal layer over the exposed portions of the metal dichalcogenide film and in contact with the metal dichalcogenide film after the plasma stripping,
    wherein the first metal layer is a layer of one or more second metals selected from the group consisting of Ni, Mo, In, Ti, W, Sc, Pd, Pt, Co, and Ru; and
    forming a second metal layer comprising a third metal over the first metal layer,
    wherein the third metal is less reactive than the one or more second metals.

10. The method according to claim 9, wherein the buffer layer is a photoresist layer or an oxide layer.

11. The method according to claim 9, wherein the plasma stripping includes replacing the chalcogen in the surface layer of the exposed portions of the metal dichalcogenide film with hydrogen.

12. The method according to claim 11, wherein the forming a first metal layer includes replacing the hydrogen with the one or more second metals.

13. The method according to claim 9, wherein the plasma stripping is performed at a plasma pressure ranging from 10 mTorr to 500 mTorr, and a power ranging from 10 W to 150 W.

14. The method according to claim 9, wherein the first metal is one or more selected from the group consisting of Mo, W, Pd, and Hf.

15. A method of fabricating a semiconductor device, comprising:
    forming a first metal dichalcogenide monolayer film over a substrate,
    forming a second metal dichalcogenide monolayer film over the first metal dichalcogenide monolayer film,
    wherein the first and second metal dichalcogenide films comprise a first metal and a chalcogen selected from the group consisting of S, Se, Te, and combinations thereof;
    patterning the second metal dichalcogenide monolayer film to expose portions of the first metal dichalcogenide monolayer film;
    applying a plasma to the exposed portions of the first metal dichalcogenide monolayer film; and
    forming a metal layer over the exposed portions of the first metal dichalcogenide monolayer film after applying the plasma.

16. The method according to claim 15, wherein the metal layer is a layer of one or more second metals selected from the group consisting of Ni, Mo, In, Ti, W, Sc, Pd, Pt, Co, and Ru.

17. The method according to claim 15, further comprising forming a second metal layer comprising a third metal over the metal layer.

18. The method according to claim 16, wherein the third metal is one or more selected from the group consisting of Au, Pt, Cu, and TiN.

19. The method according to claim 15, wherein the plasma is a hydrogen plasma.

20. The method according to claim 15, wherein the pressure of the plasma ranges from 10 mTorr to 500 mTorr, and the plasma is applied at a power ranging from 10 W to 150 W.

* * * * *